United States Patent
Tian et al.

(10) Patent No.: US 7,750,386 B2
(45) Date of Patent: Jul. 6, 2010

(54) MEMORY CELLS INCLUDING NANOPOROUS LAYERS CONTAINING CONDUCTIVE MATERIAL

(75) Inventors: Wei Tian, Bloomington, MN (US); Venkatram Venkatasamy, Edina, MN (US); Ming Sun, Eden Prairie, MN (US); Michael Xuefei Tang, Bloomington, MN (US); Insik Jin, Eagan, MN (US); Dimitar V. Dimitrov, Edina, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 12/269,507

(22) Filed: Nov. 12, 2008

(65) Prior Publication Data

US 2010/0117051 A1    May 13, 2010

(51) Int. Cl.
*H01L 29/76* (2006.01)
*H01L 21/8242* (2006.01)

(52) U.S. Cl. .................. 257/296; 257/300; 257/311; 438/239; 438/253

(58) Field of Classification Search ............... 438/238, 438/239, 250, 253, 393, 396; 257/295, 296, 257/298, 300, 311
See application file for complete search history.

(56) References Cited

U.S. PATENT DOCUMENTS

| | | | |
|---|---|---|---|
| 5,761,115 A | 6/1998 | Kozicki | |
| 6,611,034 B2 * | 8/2003 | Den | 257/421 |
| 6,949,793 B2 * | 9/2005 | Choi et al. | 257/316 |
| 6,985,378 B2 | 1/2006 | Kozicki | |
| 7,093,347 B2 | 8/2006 | Nowak | |
| 7,189,435 B2 | 3/2007 | Tuominen | |
| 7,369,427 B2 | 5/2008 | Diao | |
| 7,430,135 B2 | 9/2008 | Huai | |
| 7,518,835 B2 | 4/2009 | Huai | |
| 7,576,956 B2 | 8/2009 | Huai | |
| 2004/0052117 A1 * | 3/2004 | Jiang | 365/200 |
| 2006/0046379 A1 * | 3/2006 | Symanczyk et al. | 438/238 |
| 2006/0060832 A1 | 3/2006 | Symanczyk | |
| 2006/0245117 A1 | 11/2006 | Nowak | |
| 2007/0171694 A1 | 7/2007 | Huai | |
| 2008/0026253 A1 | 1/2008 | Yuasa | |
| 2008/0061388 A1 | 3/2008 | Diao | |
| 2008/0180991 A1 | 7/2008 | Wang | |
| 2009/0262638 A1 | 10/2009 | Xi | |
| 2010/0006813 A1 | 1/2010 | Xi | |

OTHER PUBLICATIONS

W.W. Zhuang et al., Tech Dig. IEDM (2002) 193.
G.I. Baek et al., Tech. Dig. IEDM (2005) 750.
G.I. Baek et al., Tech. Dig. IEDM (2004) 587.
T. Thurn-Albrecht et al., Science, 290, 2126 (2000).

(Continued)

*Primary Examiner*—Kevin M Picardat
(74) *Attorney, Agent, or Firm*—Campbell Nelson Whipps LLC

(57) ABSTRACT

A memory cell that includes a first contact having a first surface and an opposing second surface; a second contact having a first surface and an opposing second surface; a memory material layer having a first surface and an opposing second surface; and a nanoporous layer having a first surface and an opposing second surface, the nanoporous layer including at least one nanopore and dielectric material, the at least one nanopore being substantially filled with a conductive metal, wherein a surface of the nanoporous layer is in contact with a surface of the first contact or the second contact and the second surface of the nanoporous layer is in contact with a surface of the memory material layer.

21 Claims, 5 Drawing Sheets

OTHER PUBLICATIONS

Hideki Masuda and Kenji Fukuda, Science, 268, 1466 91995).

Masuda et al., Ordered Metal Nanohole Arrays Made by a Two-Step Replication of Honeycomb Structures of Anodic Alumina, Science, Ol. 268, Jun. 9, 1995.

Song-Zhu Chu et al., Fabrication of Ideally Ordered Nanoporous Alumina Films and Integrated Alumina Nanotubule Arrays by High-Field Anodization, Adv. Mater. 2005, 17, 2115-2119.

Macak et al., High-Aspect-Ratio TiO2, Nanotubes by Anodization of Titanium, Angew. Chem. Int. Ed. 2005, 44, 2100-2102.

A. Huczko, Template-Based Synthesis of Nanomaterials, Appl. Phys. A 70, 365-376 (2000).

U.S. Appl. No. 12/269,537, filed Nov. 12, 2008, Tang.

U.S. Appl. No. 12/269,514, filed Nov. 12, 2008, Venkatasamy.

\* cited by examiner

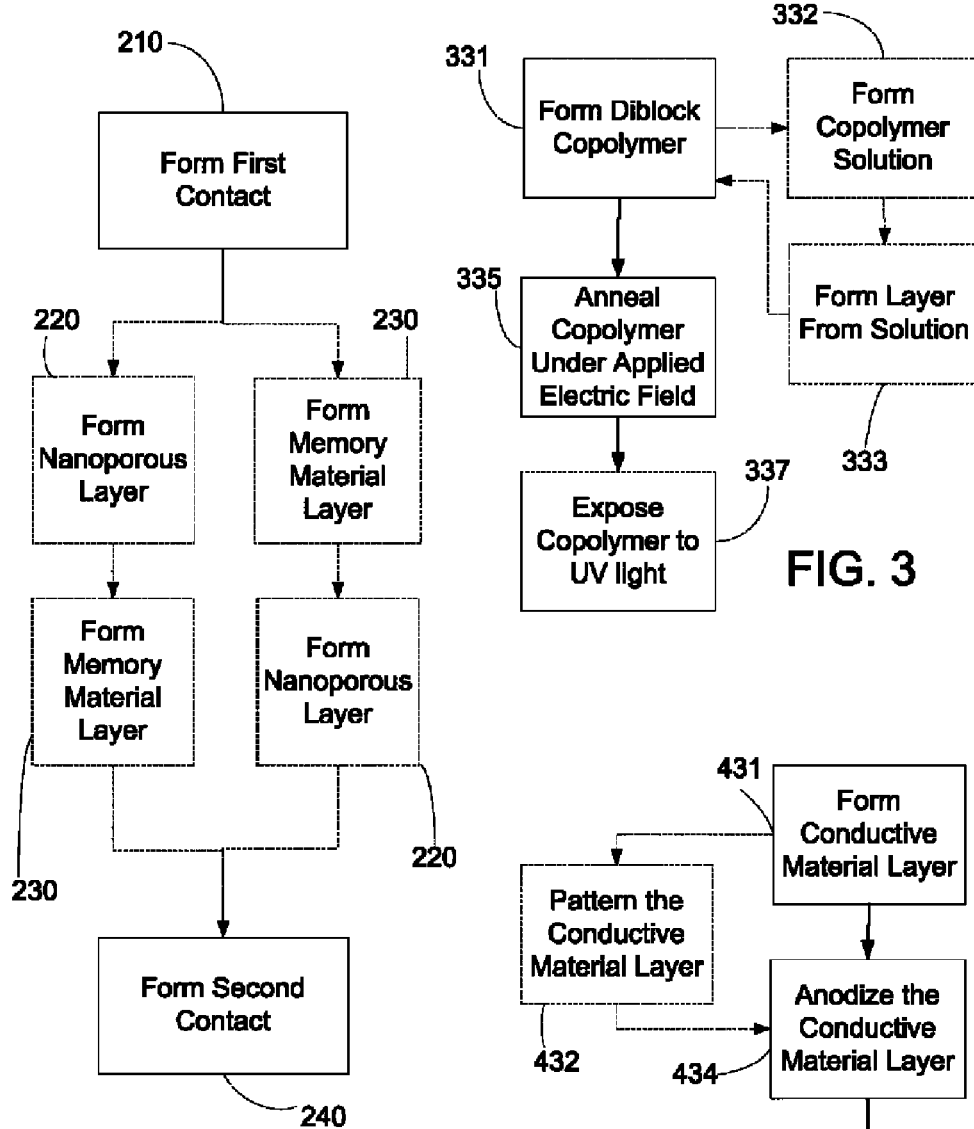

US 7,750,386 B2

MEMORY CELLS INCLUDING NANOPOROUS LAYERS CONTAINING CONDUCTIVE MATERIAL

BACKGROUND

Resistive random access memory (RRAM), programmable metallization cells (PMC), phase change memory (PCM), and spin torque transfer random access memory (STRAM) are thought to be candidates for the next generation of memory materials. RRAM, PMC, and PCM generally includes insulating or semiconducting material whose resistance state can be switched between low and high to designate a "1" or a "0". STRAM generally includes a magnetic tunnel junction (MTJ) whose resistance can be switched by an electric field to designate a "1" or a "0". RRAM, PMC, and PCM can exhibit variability in the amount of current necessary to switch the resistance state and STRAM can suffer from the necessity of utilizing a relatively large switching current. The advancement of RRAM, PMC, PCM, and STRAM could be benefited by providing solutions to these concerns.

BRIEF SUMMARY

Disclosed herein is a memory cell that includes a first contact having a first surface and an opposing second surface; a second contact having a first surface and an opposing second surface; a memory material layer having a first surface and an opposing second surface; and a nanoporous layer having a first surface and an opposing second surface, the nanoporous layer including at least one nanopore and dielectric material, the at least one nanopore being substantially filled with a conductive metal, wherein a surface of the nanoporous layer is in contact with a surface of the first contact or the second contact and the second surface of the nanoporous layer is in contact with a surface of the memory material layer.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which:

FIG. 2 is a flowchart illustrating exemplary methods for forming a memory cell;

FIG. 3 is a flowchart illustrating an exemplary method for forming a nanoporous layer;

FIG. 4 is a flowchart illustrating exemplary methods for forming a nanoporous layer;

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1A:
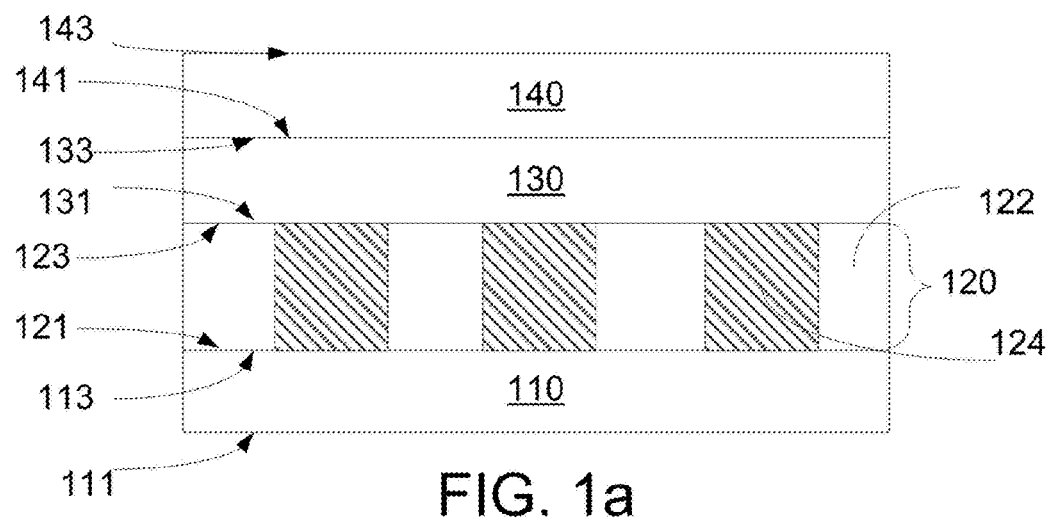
FIGS. 1a, 1b and 1c are cross sectional views (FIGS. 1a and 1b) of a memory cell and a perspective view (FIG. 1c) of an exemplary nanoporous layer of a memory cell.

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

Spatially related terms, including but not limited to, "lower", "upper", "beneath", "below", "above", and "on top", if used herein, are utilized for ease of description to describe spatial relationships of an element(s) to another. Such spatially related terms encompass different orientations of the device in use or operation in addition to the particular orientations depicted in the figures and described herein. For example, if a cell depicted in the figures is turned over or flipped over, portions previously described as below or beneath other elements would then be above those other elements.

As used herein, when an element, component or layer for example is described as being "on" "connected to", "coupled with" or "in contact with" another element, component or layer, it can be directly on, directly connected to, directly coupled with, in direct contact with, or intervening elements, components or layers may be on, connected, coupled or in contact with the particular element, component or layer, for example. When an element, component or layer for example is referred to as begin "directly on", "directly connected to", "directly coupled with", or "directly in contact with" another element, there are no intervening elements, components or layers for example.

Disclosed herein are memory cells, devices and arrays including memory cells and methods of forming memory cells. Memory cells as disclosed herein that utilize RRAM materials can include structures that can minimize, control, or both minimize and control the conductive paths, the population of conductive filaments, the dimensions of the conductive filaments, or a combination thereof in order to reduce variability in switching current. Memory cells as disclosed herein that include STRAM material can include structures that can minimize, control or both minimize and control the area of electrical contact across the MTJ in order to reduce the switching current.

Figure 1B:
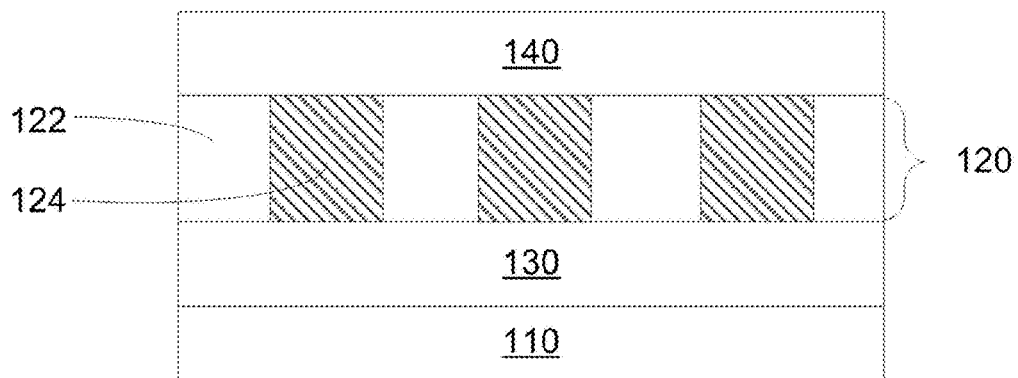

An illustrative example of a memory cell is depicted in FIG. 1a. An embodiment of a memory cell 100 includes a first contact 110, a nanoporous layer 120, a memory material layer 130 and a second contact 140. The first contact 110 can have a first surface 111 and a second surface 113; the nanoporous layer 120 can have a first surface 121 and a second surface 123; the memory material layer 130 can have a first surface 131 and a second surface 133; and the second contact 140 can have a first surface 141 and a second surface 143. When "a surface" of an element is referred to, either the first surface or the second surface is being referred to. For example, the phrase "a surface of the first contact 110" is referring to either the first surface 111 of the first contact 110 or the second surface 113 of the first contact 110. In an embodiment, a surface of the nanoporous layer 120 is in contact with a surface of the first contact 110 or a surface of the second contact 140. In an embodiment, the first surface 121 of the nanoporous layer 120 can be in contact with the second surface 113 of the first contact 110 (FIG. 1a); and in an embodiment, the second surface 123 of the nanoporous layer 120 can be in contact with the first surface 141 of the second contact 140 (FIG. 1b).

In an embodiment (depicted in FIG. 1a), the nanoporous layer 120 is positioned between the first contact 110 and the memory material layer 130. In such an embodiment, the first surface 121 of the nanoporous layer 120 is adjacent to, or in contact with the second surface 113 of the first contact 110; and the second surface 123 of the nanoporous layer 120 is adjacent to, or in contact with the first surface 131 of the memory material layer 130. The first surface 141 of the second contact 140 in such an embodiment is adjacent to, or in contact with the second surface 133 of the memory material layer 130.

In an embodiment (depicted in FIG. 1b), the nanoporous layer is positioned between the memory material layer 130 and the second contact 140. In such an embodiment, the second surface 113 of the first contact 110 is adjacent to, or in contact with the first surface 131 of the memory material layer 130; and the second surface 133 of the memory material layer 130 is adjacent to, or in contact with the first surface 121 of the nanoporous layer 120. The second surface 123 of the nanoporous layer 120 is adjacent to, or in contact with, the first surface 141 of the second contact 140.

The first and second contacts 110 and 140 respectively can be formed of any suitable conductive material. In an embodiment, a suitable conductive material can include, but is not limited to, tungsten (W), nickel (Ni), molybdenum (Mo), platinum (Pt), gold (Au), palladium (Pd), rhodium (Rh), titanium nitride (TiN), tantalum nitride (TaN) and titanium tungstide (TiW) for example. Generally, the first and second contacts 110 and 140 can have thicknesses as are commonly utilized. In an embodiment, the first and second contacts 110 and 140 can have a thickness from about 50 Å to about 5000 Å.

Figure 1C:
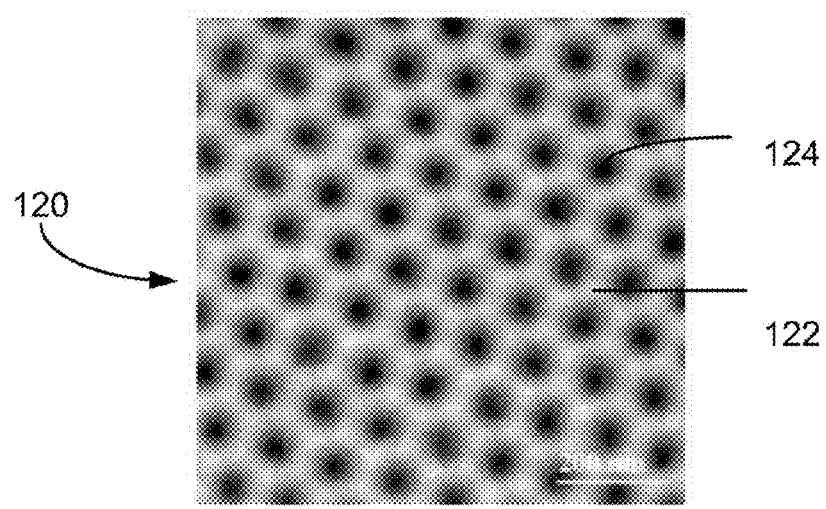

The nanoporous layer 120 generally includes at least one pore and dielectric material; and in an embodiment includes at least one nanopore 124 and dielectric material 122. In an embodiment, the nanoporous layer 120 includes a plurality of pores, for example a plurality of nanopores 124. In an embodiment, the plurality of nanopores are dispersed, randomly or uniformly, throughout the dielectric material. In an embodiment, the dielectric material 122 can be continuous and the nanopores 124 can be dispersed within the continuous dielectric material 122. FIG. 1c illustrates a perspective view of an exemplary nanoporous layer 120 showing the nanopores 124 and the continuous nature of the dielectric material 122.

In an embodiment, the nanopores 124 can have uniform, substantially uniform, variable (or any characterization in between) diameters. In an embodiment, the nanopores 124 can have diameters in the nanometer (nm) range. In an embodiment, the nanopores can have diameters from about 2 nm to about 200 nm. In an embodiment, the nanopores can have diameters from about 4 nm to about 100 nm. In an embodiment, the nanopores 124 can have variable depths; and in an embodiment the depth of the nanopores can be substantially similar. In an embodiment, the nanopores 124 span the entire thickness of the nanoporous layer 120. The depth of the nanopores 124 is at least partially controlled by the depth of the starting material from which the nanoporous layer 120 is formed. In an embodiment, the depth of the nanopores 124 can depend at least in part on the particular properties (including, but not limited to switching time and switching current) that are desired in the memory cell.

In an embodiment, the nanopores 124 can be regularly dispersed in the dielectric material 122. In an embodiment the nanopores 124 can be randomly dispersed in the dielectric material. In an embodiment, portions of the nanoporous layer 120 can have regions where the nanopores 124 are uniformly distributed and portions where the nanopores 124 are less uniformly or even randomly distributed. The nanopores 124, if uniformly distributed can be distributed in any pattern. In an embodiment, the nanopores 124 can be distributed in a hexagonally arranged pattern (such as that depicted in FIG. 1c for example). In embodiments where the nanopores 124 are uniformly distributed, the distribution can be due entirely to the method of forming the nanoporous layer or can be controlled by other factors as well.

The dielectric material 122 is at least partially controlled by the material from which the nanoporous layer 120 is formed. Generally, the dielectric material 122 is one that has dielectric properties, can optionally provide mechanical stability, and can be formed as a nanoporous layer. In an embodiment, the dielectric material 122 can include dielectric inorganic materials, such as alumina ($Al_2O_3$), zirconia ($ZrO_2$), titania ($TiO_2$) and mesoporous silica; polymers such as polystyrene and electrically conductive polymers such as polypyrrole, poly(3-methylothiophene) and polyaniline. In an embodiment where the dielectric material 122 is a polymer, it can be a crosslinked polymer, such as crosslinked polystyrene.

The structure of the dielectric material 122 is generally controlled by the distribution and shape of the nanopores 124 which is at least partially controlled by the way in which the nanoporous layer 120 is formed. In an embodiment, the thickness of the dielectric material 122 is dependent, at least in part, on the thickness of the material from which the nanoporous layer 120 was formed, the method by which the nanoporous layer 120 was formed and any processing steps that were carried out on the nanoporous layer 120 during formation. In an embodiment, the dielectric material 122 or the nanoporous layer 120 has a thickness from about 5 nm to about 50 nm.

A memory cell as disclosed herein has the at least one nanopore 124 in the nanoporous layer 120 at least substantially filled with a conductive material, for example a conductive metal. The conductive material within the at least one nanopore 124 generally functions to electrically connect the first contact to the second contact through the memory material layer. The conductive material within the nanopores minimizes controls, or both minimizes and controls the area of electrical contact through the memory material layer, thereby providing advantageous properties to the memory cell (such as decreased switching current, less variability in switching current, or some combination thereof).

In an embodiment, the nanopores are at least substantially filled with conductive material. In an embodiment, the nanopores are substantially completely filled with conductive material. In an embodiment, the nanopores are completely filled with conductive material. The conductive material within the nanopores can generally include any conductive metal. In an embodiment, the conductive metal can include, but is not limited to silver (Ag), copper (Cu), gold (Au), nickel (Ni), platinum (Pt) and palladium (Pd). In an embodiment, the conductive metal can include, but is not limited to, silver, copper or gold.

Memory cells 100 as disclosed herein also include memory material layer 130. The memory material layer 130 can be made of resistive random access memory (RRAM) materials, phase change memory (PCM) materials, programmable metallization cell (PMC) materials or spin torque transfer random access memory (STRAM) materials. Exemplary STRAM materials include those utilized in magnetic tunnel junctions (MTJs).

Specific types of RRAM materials include oxide materials for example, metal oxides. In some embodiments, the metal oxide can be a binary oxide material or a complex metal oxide material. Binary metal oxide materials can be expressed as $M_xO_y$. In this formula, the characters "M", "O", "x", and "y" refer to metal, oxygen, a metal composition ratio, and an oxygen composition ratio, respectively. The metal "M" may be a transition metal and/or aluminum (Al). In this case, the transition metal may be nickel (Ni), niobium (Nb), titanium (Ti), zirconium (Zr), hafnium (Hf), cobalt (Co), iron (Fe), copper (Cu) and/or chrome (Cr). Specific examples of binary metal oxides that may be used as the RRAM material include, but are not limited to, CuO, NiO, CoO, ZnO, $CrO_2$, $TiO_2$, $HfO_2$, $ZrO_2$, $Fe_2O_3$, and $Nb_2O_5$. In some embodiments, the metal oxide can be any useful complex metal oxide such as, for example, pervovskites, which include complex oxide materials such as $Pr_{0.7}Ca_{0.3}MnO_3$, or $La_{0.7}Ca_{0.4}MnO3$, or $SrTiO_3$, or $SiZrO_3$, or $Pb(Zr_xTi_{1-x})O_3$ or these oxides doped with Cr or Nb. The complex can also include $LaCuO_4$, or $Bi_2Sr_2CaCu_2O_8$.

In other embodiments, the PMC material can be chalcogenide solid electrolyte materials or oxide materials with large ion conductivity or an organic/polymer material. An example of a solid chalcogenide material is a germanium-selenide ($Ge_xSe_{1-x}$) containing a silver (Ag) component. An example of an oxide material is a $WO_3$ or $SiO_2$. An example of an organic material is poly(3,4-ethylenedioxythiophene) (i.e., PEDOT).

In other embodiments, the PCM material can be chalcogenide materials. One example of a chalcogenide material is $Ge_2Sb_2Te_5$ (GST).

In an embodiment, the memory material layer 130 can be made of STRAM materials. Exemplary STRAM materials can include a three (or more) layer stack referred to as a magnetic tunnel junction (MTJ). A MTJ can generally include a first magnetic layer and a second magnetic layer that are generally made of ferromagnetic alloys such as iron (Fe), cobalt (Co), and nickel (Ni) alloys. Exemplary alloys can include, but are not limited to CoFeB, CoFe, NiFe, FeMn, NiO, IrMn, PtMn, PtPdMn, NiMn and TbCo for example. The MTJ also includes an insulating layer, positioned between the first and second magnetic layers; the insulating layer is generally made of an insulating material such as aluminum oxide ($Al_2O_3$) or titanium oxide ($TiO_2$) or magnesium oxide (MgO) for example.

Also disclosed herein are methods of forming memory cells. Methods of forming memory cells as disclosed herein can offer advantages over other methods of forming memory cells. FIG. 2 illustrates exemplary methods of producing a memory cell as disclosed herein. The methods depicted in FIG. 2 begin with step 210, forming a first contact. As discussed above, the first contact can be formed of any suitable conductive material; exemplary materials include, but are not limited to, tungsten (W), nickel (Ni), molybdenum (Mo), platinum (Pt), gold (Au), palladium (Pd), rhodium (Rh), titanium nitride (TiN), tantalum nitride (TaN) and titanium tungsten (TiW) for example.

The first contact can be, but need not be formed on, partially in, or in a substrate. The substrate, if utilized, can include any substrate commonly utilized to fabricate memory devices. Exemplary substrates include, but are not limited to silicon, a mixture of silicon and germanium, and other similar materials. Generally, the first contact can be formed by using known deposition methods, such as for example physical vapor deposition (PVD), chemical vapor deposition (CVD), electrochemical deposition (ECD), molecular beam epitaxy (MBE) and atomic layer deposition (ALD).

The methods depicted in FIG. 2 offer two alternative paths. After formation of the first contact, one of two alternative sequences of steps can be carried out. The optional left side of FIG. 2, steps 220 and 230 in that order, can be utilized to form a memory cell as exemplified in FIG. 1a; and the optional right side of FIG. 2, steps 230 and 220, in that order can be utilized to form a memory cell as exemplified in FIG. 1b. It will also be understood that the method could be carried out in reverse, i.e. form the second contact first, followed by either step 230 or step 220 and finally step 210.

Formation of a nanoporous layer is step 220. The nanoporous layer can be formed adjacent to, on, or directly on the first contact (optional left side of FIG. 2) or adjacent to, on, or directly on the memory layer (optional right side of FIG. 2). As discussed above, the nanoporous layer includes at least one nanopore and dielectric material. The nanoporous layer can be formed using commonly utilized methods. Two exemplary methods of forming nanoporous layers are illustrated in FIGS. 3 and 4.

One exemplary method of forming the nanoporous layer is through formation and processing of diblock copolymers. Such a method generally utilizes the self-assembled morphology of diblock copolymer thin films. Such methods are based on well-ordered equilibrium structures, which can be controlled by macromolecular properties, scaled by the molecular weight of the components and utilized with numerous block copolymer combinations. Formation of a nanoporous layer utilizing diblock copolymers will be demonstrated through the use of polystyrene and polymethylmethacrylate; however, it can be carried out using other polymers. Examples of other polymers can include, but are not limited to polypyrrole, poly (3-methylothiophene) and polyaniline.

The exemplary steps in FIG. 3 include step 331, formation of a diblock copolymer. One exemplary way of forming a diblock copolymer includes optional steps 332, forming a copolymer solution and 333, forming a layer from the copolymer solution. Step 332 can include combining the two polymer materials in a suitable solvent. The choice of solvents can depend, at least in part on the particular polymers utilized. In an exemplary embodiment utilizing polystyrene and polymethylmethacrylate, toluene can be utilized as a solvent. Step 333 can include forming a layer or film from the copolymer solution. In an embodiment utilizing polystyrene and polymethylmethacrylate, a film can be formed from a toluene solution using spin casting methods.

After formation of the diblock copolymer, step 331, the next step in an exemplary method includes annealing the copolymer under an applied electric field. This step can function to cause cylindrical microdomains of the two polymers to orient parallel to the electric field lines. After this step, the diblock copolymer can be characterized as a block of one of the polymers that contains columnar deposits of the other polymer. After this step, the next step, step 337, includes exposing the copolymer to UV light. This step functions to degrade the polymer that has formed columnar deposits within the other polymer. In an embodiment where polystyrene and polymethylmethacrylate are utilized, the polymethylmethacrylate will form columnar deposits within the polystyrene, and will be broken down by the UV exposure. This will ultimately form a block of polystyrene (which can be at least partially crosslinked by the UV light) with columnar voids (where the polymethylmethacrylate was located before the UV exposure).

A specific method of forming a nanoporous layer utilizing diblock copolymers can be described as follows. Polystyrene (0.71 volume fraction) and polymethylmethacrylate with a molecular weight of 39,600 daltons and a polydispersity of 1.08 can be dissolved in toluene. The solution can then be spin-cast into a diblock copolymer film (about 1 micrometer (μm) thick) onto a conducting substrate (e.g. the active electrode). The copolymer film can then be annealed for about 14 hours, above the glass transition temperature of both components (105° C. for polystyrene and 115° C. for polymethylmethacrylate) or about 165° C. under an applied electric field (dc field of 30 to 40 V/μm can be applied across the active electrode and a second conductive material, such as a Kapton film placed over the copolymer). The sample can then be cooled to room temperature, the field removed and the second conductive material removed. Then, the diblock copolymer can be subjected to ultraviolet exposure (25 J/cm$^2$). After UV exposure, the diblock copolymer can be rinsed, for example with acetic acid, to remove the degraded polymethylmethacrylate. Such a method can be utilized to fabricate an array of 14 nm diameter cylindrical voids in a crosslinked polystyrene matrix with a lattice constant of about 24 nm.

Another method for forming a nanoporous layer includes electrochemical processing (e.g. oxidation) of a material, in an embodiment a conductive material such as aluminum (Al), titanium (Ti) or zirconium (Zr). An exemplary method is depicted in FIG. 4 and is exemplified with respect to aluminum (Al), although other materials (such as titanium (Ti), zirconium (Zr) and silica (Si) for example) can also be utilized. An initial step in such a method can include step 431, forming a conductive material (e.g. aluminum) layer. In an embodiment, the aluminum layer can have a generally uniform thickness from about 5 nm to about 50 nm. An aluminum layer can be formed using known methods, including but not limited to PVD, CVD, ECD, MBE and ALD. The next step, step 434, includes anodizing the aluminum layer. Generally, anodizing the aluminum functions to convert at least a portion of the aluminum to aluminum oxide or alumina ($Al_2O_3$). The process of anodizing aluminum not only converts at least a portion of the aluminum to alumina but also creates pores in the alumina.

In an embodiment, anodization can be carried out by submerging the aluminum layer in an acidic solution and applying a voltage to the aluminum. In an embodiment, the aluminum can function as the anode and a platinum electrode placed in the solution can serve as the cathode. In an embodiment, anodization can be carried out using an oxalic acid solution (e.g. 0.3 M oxalic acid solution) and applying a constant voltage of about 40 V for example. The process can be carried out at low temperatures for example, from about 2° C. to about 5° C. The arrangement of the pores in the alumina can be controlled, at least in part, by the conditions of anodization. In an embodiment, anodization for longer periods than necessary can be utilized to prepare alumina with more ordered pores. Generally, the size of regions of highly ordered pores (which can be referred to as defect free regions) can be increased by increasing the anodization time. The uniformity of the pores can generally be increased by increasing the thickness of the aluminum (Al) layer that is anodized.

FIG. 4 illustrates an optional step that can be utilized to increase the regularity of the pores in the nanoporous layer. Optional step 432 includes patterning the layer, e.g. the aluminum layer, before it is anodized. Patterning the aluminum layer can function to at least partially control the location of the pores. Generally, a "defect" in the aluminum layer can dictate where a pore will be formed within the alumina. Patterning can create ordered "defects" on the surface of the aluminum. Patterning can be accomplished as is generally known, including but not limited to, pretexturing the aluminum layer, by using for example, a textured silicon carbide (SiC) molder to produce indentations on the aluminum.

After the aluminum layer is anodized (whether pre-patterned or not), the next step, step 436, is to remove unanodized aluminum. In embodiments, there can be a portion of the aluminum which was not anodized, i.e. not converted into alumina and through which pores were not created. Generally, a chemical method can be utilized to remove the unanodized aluminum. In an embodiment, an acid can be utilized to remove the unanodized aluminum; for example with a saturated solution of $HgCl_2$. In an embodiment, the pore size can be controlled or modified by post-processing methods, such as treatment with an acidic solution (e.g., 5% by weigh phosphoric acid solution at 30° C.).

Step 220, forming the nanoporous layer can also include at least partially filling at least one nanopore of the nanoporous layer with a conductive material. As discussed above, the conductive metal can include any conductive metal, including, but not limited to, silver (Ag), copper (Cu), gold (Au), nickel (Ni), platinum (Pt) or palladium (Pd). The conductive material can be deposited via electrodeposition, CVD, or PVD for example.

One method of at least partially filling the at least one nanopore of the nanoporous layer includes electrodepositing the conductive material. This step can be accomplished using generally utilized electrodepositing techniques. In an embodiment, conductive material can be deposited in at least a portion of the nanopores. The first contact can function as the electrode in the electrodeposition process, this will allow for deposition of the conductive material inside the pores only, as the dielectric material is non-conducting. In an embodiment where the electrodeposition process results in the nanopores being overfilled (thereby "spilling" conductive material onto the top surface of the nanoporous layer) further processing steps can be carried out to remove the conductive material from the surface of the nanoporous layer. Such steps can include, for example, chemical mechanical planarization (CMP). In an embodiment, the conductive material can at least substantially fill at least one nanopore. In an embodiment, the conductive material can at least substantially fill at least some of the nanopores. In an embodiment, the conductive material can at least substantially fill a majority of the nanopores. In an embodiment, the conductive material can at least substantially fill substantially all of the nanopores. In an embodiment, the conductive material can completely fill at least one, at least some, a majority, substantially all, or all the nanopores in the nanoporous layer.

The next step in methods as disclosed in FIG. 2 is to form the second contact, step 240. As discussed above, the second contact can be formed of any suitable conductive material; exemplary materials include, but are not limited to, tungsten (W), nickel (Ni), molybdenum (Mo), platinum (Pt), gold (Au), palladium (Pd), rhodium (Rh), titanium nitride (TiN), tantalum nitride (TaN) and titanium tungsten (TiW) for example. Generally, the second contact can be formed using known deposition methods, including, but not limited to, PVD, CVD, ECD, MBE and ALD.

Figure 5:
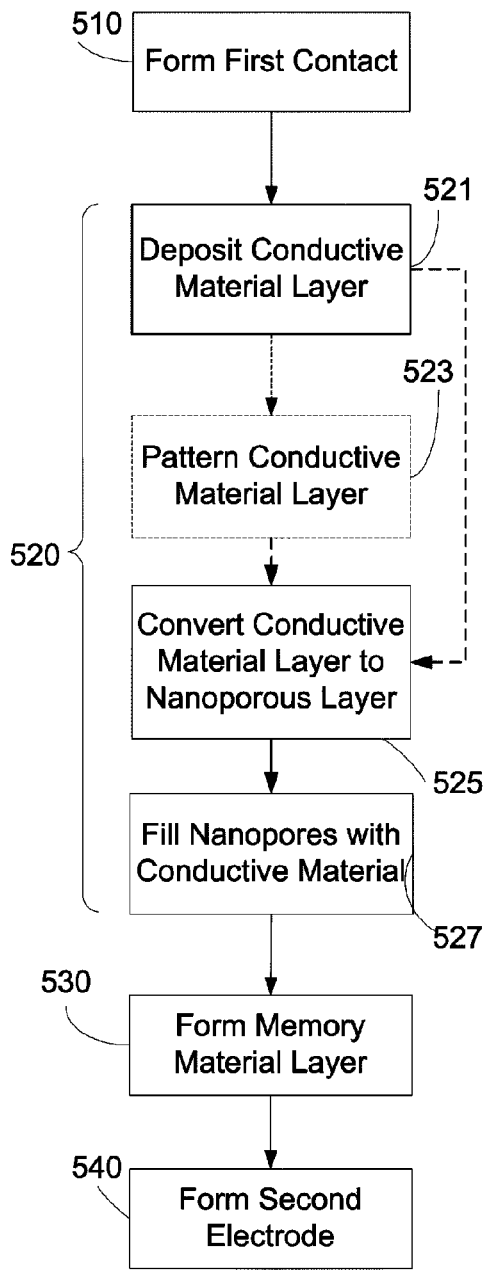
FIG. 5 is a flowchart illustrating exemplary methods for forming a memory cell.
Figure 6A:
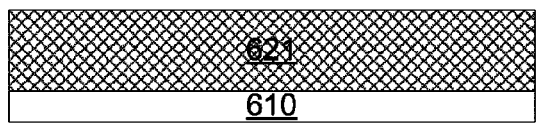
FIGS. 6a through 6f are cross-sectional views of a memory cell at various stages of manufacture.

FIG. 5 depicts another exemplary embodiment of a method of forming a memory cell as disclosed herein. FIGS. 6a through 6f depict the article at various stages during the method of manufacture. The first step in this exemplary method includes step 510, forming a first contact. The article after completion of this step is illustrated in FIG. 6a and includes first contact 610. Step 510, forming the first contact and characteristics of the first contact 610 were discussed above. As discussed above, although not depicted as such, the first contact 610 can be formed on, partially in, or in a substrate.

Steps 520 and 530 can be performed in the order presented in FIG. 5 (i.e. 520 before 530) or can be performed in reverse order (i.e. 530 and then 520). Performing the steps in the order presented can be utilized to fabricate a memory cell as disclosed in FIG. 1a and is illustrated by the sequence of FIGS. 6a through 6f. Performing step 530 then step 520 could produce a memory cell as depicted in FIG. 1b. Step 520, as depicted in FIG. 5 can include steps 521, 523, 525, and 527. As noted in FIG. 5, step 523, patterning the conductive material layer is optional and need not be carried out.

Figure 6B:
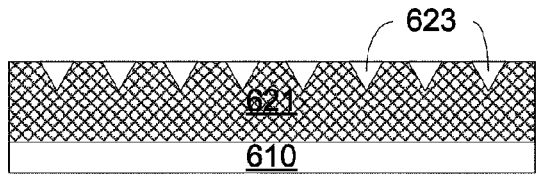

As seen in FIG. 5, the exemplified method of forming the nanoporous layer begins with step 521, depositing a conductive material, such as an aluminum (Al), zirconium (Zr) or titanium (Ti). The article after completion of this step is illustrated in FIG. 6b and includes conductive material layer 621 (e.g. an aluminum layer), disposed adjacent to, on, or directly on the first contact 610. The conductive material layer 621 can be deposited using known methods, including but not limited to, PVD, CVD, ECD, MBE and ALD. In an embodiment, the conductive material layer can have a thickness from about 5 nm to about 50 nm.

Figure 6C:
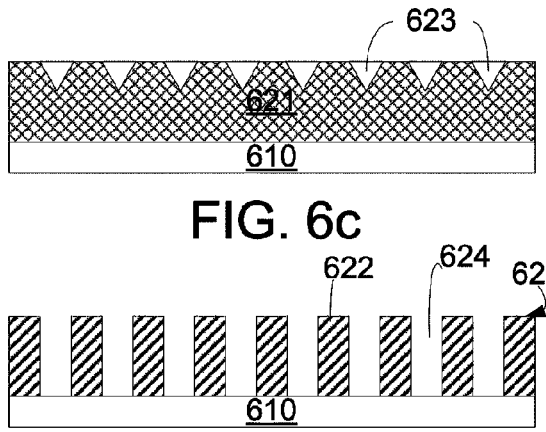

FIG. 5 also depicts an optional step, step 523, patterning the conductive material layer. The article, after completion of this step is illustrated in FIG. 6c and includes defects 623 created in the conductive material layer 621. The defects 623 can be created by for example pretexturing of the aluminum. The shape of the defects is not necessarily important, and the pyramid structures illustrated in FIG. 6c are only a non-limiting example of a type of defect that could be formed.

Figure 6D:
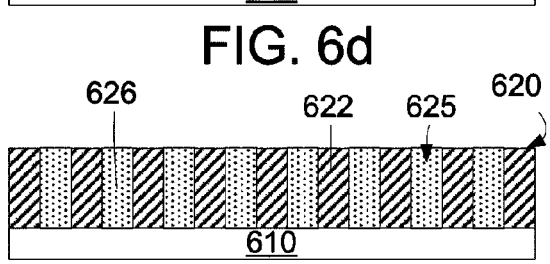

The next step, whether the optional step of patterning (step 523) was carried out or not, is to convert the conductive material layer to a nanoporous layer. Generally, this step can be carried out by oxidizing the conductive material, such as aluminum (converting it to alumina, $Al_2O_3$ which is a dielectric material) and creating pores within the alumina. One method of carrying this out is to anodize the aluminum in an acidic solution by application of a voltage. Specific exemplary parameters for carrying out this step were discussed above. FIG. 6d illustrates the article after this step has been carried out and shows the nanoporous layer 620 disposed adjacent to, on, or directly on the first contact 610. The nanoporous layer 620 includes pores 624 and dielectric material 622.

Figure 6E:
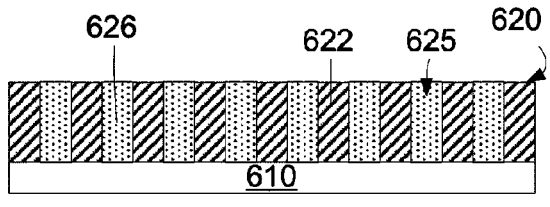

The next step, shown in FIG. 5 includes step 527, at least substantially filling at least one of the nanopores with conductive material. This step can be accomplished by electrodeposition for example. This step can be accomplished using generally utilized electrodeposition techniques. The first contact can function as the electrode in the electrodeposition process, this will allow for deposition of the conductive material inside the pores only, as the dielectric material is non-conducting. CVD or PVD could also be used to deposit these metals. FIG. 6e depicts an article after completion of this step and shows substantially filled pores 625 that are substantially filled with conductive material 626.

Once the nanoporous layer has been formed, in step 520, the next step in the exemplary method depicted in FIG. 5 is step 530, formation of the memory material layer. The memory material layer can be disposed adjacent to, on, or directly on the nanoporous layer 620. As discussed above, the memory material layer can generally be made of any kind of RRAM or STRAM materials. The particular method of depositing the material for the memory material layer can depend at least in part on the particular kind of memory material being utilized. Generally though, PVD, CVD, ECD, MBE or ALD as well as other deposition methods can be utilized to form the memory material layer.

Figure 6F:
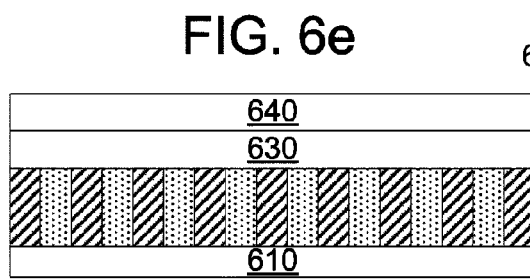

The next step, step 540 is formation of a second contact. The article after completion of step 530 and this step (step 540) is illustrated in FIG. 6f and includes memory material layer 630 and second contact 640. The second contact 640 can be disposed adjacent to, on or directly on the memory material layer 630. Step 540, forming the second contact, and characteristics of the second contact 640 were discussed above.

Figure 7:
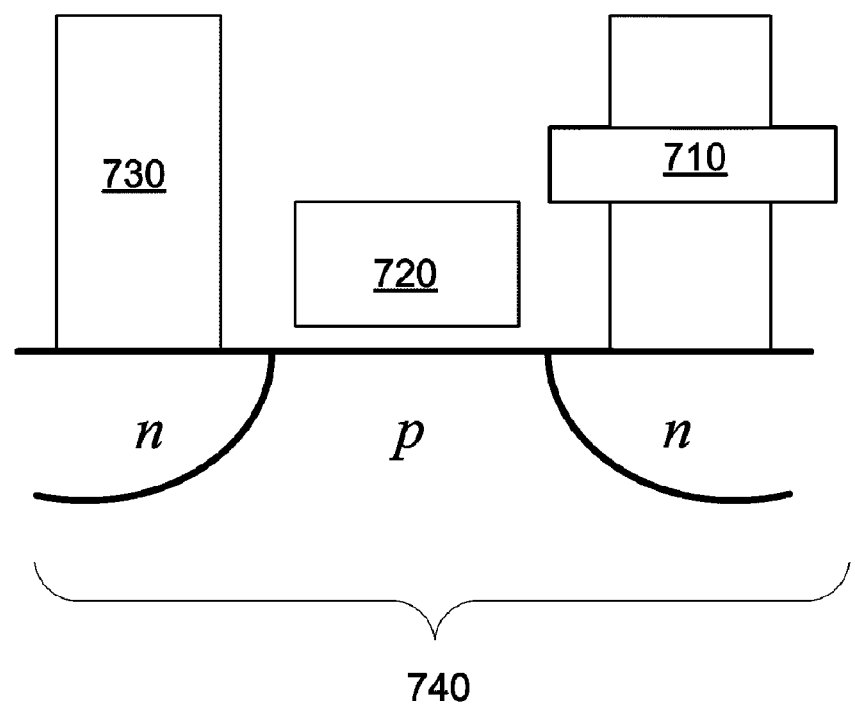
FIG. 7 is a cross sectional view of a memory cell in a 1T1R configuration.

FIG. 7 illustrates a device including a memory cell as disclosed herein, having a 1T1R configuration. A 1T1R configuration generally refers to one transistor (1T), which is exemplified in FIG. 7 as 740; and one resistor (1R) structure, which is a memory cell as disclosed herein, and is exemplified as 710. The memory device (including the memory cell 710 and the transistor 740) can be operatively connected to a system that contains the memory device via a bit line 730 and a word line 720. In an embodiment, the transistor 740 can be a metal-oxide-semiconductor field effect transistor (MOSFET).

Figure 8:
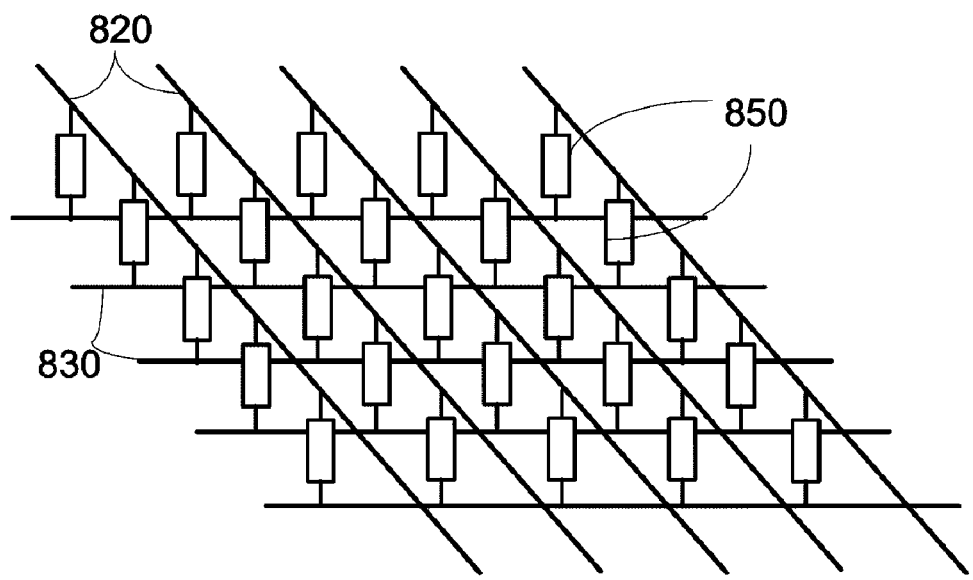
FIG. 8 is an illustration of a memory cell in a cross bar array configuration.

FIG. 8 illustrates a memory cell as disclosed herein in a crossbar array. A cross bar array includes memory devices 850, that each include a memory cell and a selective element, at least one word line 820 and at least one bit line 830. The word lines 820 and the bit lines 830 are generally orthogonal to each other, and each of the plurality of memory devices 850 are disposed at an intersection of a word line 820 and a bit line 830.

Figure 9:
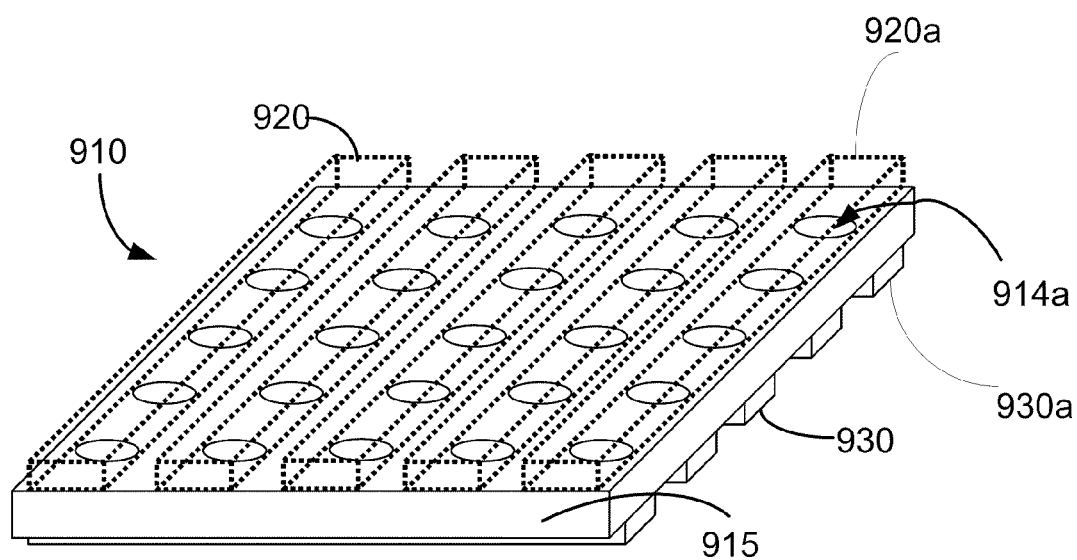
FIG. 9 is a perspective view of an illustrative memory array including memory cells.

FIG. 9 illustrates another configuration of a memory array 910 having a plurality of word lines 920 and bit lines 930; the bit lines 930 may be orthogonal to the word lines 920. An exemplary word line 920a and bit line 930a are operatively connected to a memory cell 914a. The memory cell 914a may be part of a memory cell structure 915 which can include a plurality of memory cells 914, or can have a similar layered structure across the entirety of the memory cell structure 915, with memory cells 914 being defined only by the intersection of the word lines 920 and the bit lines 930. The exemplary memory array 910 is a crosspoint array structure. A select device, such as diode or transistor, although not pictured in this figure, may also be present at each crosspoint.

Memory cells as disclosed herein can be included in stand alone devices or can be integrated or embedded in devices that utilize the RAM, including but not limited to microprocessors (e.g., computer systems such as a PC e.g., a notebook computer or a desktop computer or a server) microcontrollers, dedicated machines such as cameras, and video or audio playback devices.

Thus, embodiments of MEMORY CELLS INCLUDING NANOPOROUS LAYERS CONTAINING CONDUCTIVE MATERIAL are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present disclosure is limited only by the claims that follow.

What is claimed is:

1. A memory cell comprising:
    a first contact having a first surface and an opposing second surface;
    a second contact having a first surface and an opposing second surface;
    a memory material layer having a first surface and an opposing second surface; and
    a nanoporous layer having a first surface and an opposing second surface, the nanoporous layer comprising at least one nanopore and dielectric material, the at least one nanopore being substantially filled with a conductive metal,
    wherein the first surface of the nanoporous layer is in contact with a surface of the first contact or the second contact and the opposing second surface of the nanoporous layer is in contact with a surface of the memory material layer.

2. The memory cell according to claim 1, wherein the memory material layer comprises a resistive random access memory (RRAM) material, a phase change memory (PCM) material, a programmable metallization cell (PMC) material or a spin torque transfer random access memory (STRAM) material.

3. The memory cell according to claim 1, wherein the nanoporous layer comprises crosslinked polymer.

4. The memory cell according to claim 3, wherein the nanoporous layer comprises crosslinked polystyrene.

5. The memory cell according to claim 1, wherein the nanoporous layer comprises alumina ($Al_2O_3$), zirconia ($ZrO_2$) or titania ($TiO_2$).

6. The memory cell according to claim 1, wherein the nanoporous layer comprises a plurality of nanopores.

7. The memory cell according to claim 6, wherein the plurality of nanopores are distributed in a hexagonally arranged pattern.

8. The memory cell according to claim 6, wherein the dielectric material is continuous in the nanoporous layer and the plurality of nanopores are randomly dispersed throughout the dielectric material.

9. The memory cell according to claim 1, wherein the at least one nanopore has a diameter from about 2 nm to about 200 nm.

10. The memory cell according to claim 1, wherein the conductive metal substantially filling the at least one nanopore is chosen from the group consisting of: silver (Ag), copper (Cu), nickel (Ni) gold (Au), platinum (Pt) and palladium (Pd).

11. The memory cell according to claim 1, wherein the nanoporous layer has a thickness from about 5 nm to about 50 nm.

12. A memory array comprising:
    a plurality of memory cells, each memory cell comprising:
        a first contact having a first surface and an opposing second surface;
        a second contact having a first surface and an opposing second surface;
        a memory material layer having a first surface and an opposing second surface; and
        a nanoporous layer having a first surface and an opposing second surface, the nanoporous layer comprising at least one nanopore and dielectric material, the at least one nanopore being substantially filled with a conductive metal,
        wherein the first surface of the nanoporous layer is in contact with a surface of the first contact or the second contact and the second opposing surface of the nanoporous layer is in contact with a surface of the memory material layer;
    a plurality of transistors coupled to the plurality of memory cells;
    at least one word line; and
    at least one bit line,
    wherein the word line is generally orthogonal to the bit line and each of the plurality of memory cells are operatively coupled to a word line and a bit line.

13. The memory array according to claim 12, wherein the memory material layer comprises a resistive random access memory (RRAM) material, a phase change memory (PCM) material, a programmable metallization cell (PMC) material or a spin torque transfer random access memory (STRAM) material.

14. The memory array according to claim 12 wherein the nanoporous layer comprises crosslinked polymer.

15. The memory array according to claim 12, wherein the nanoporous layer comprises a plurality of nanopores, where each of the plurality of nanopores has a diameter from about 2 nm to about 200 nm.

16. The memory array according to claim 12, wherein the conductive metal substantially filling the at least one nanopore is chosen from the group consisting of: silver (Ag), copper (Cu), nickel (Ni) gold (Au), platinum (Pt) and palladium (Pd).

17. A method of forming a memory cell comprising the steps of:
    forming a first contact layer by depositing a first conductive material on a substrate;
    depositing a nanoporous layer on the first contact layer;
    creating a plurality of nanopores in the nanoporous layer;
    filling the nanopores with a second conductive material;
    forming a memory material layer adjacent the nanoporous layer;
    forming a second contact layer by depositing a third conductive material on the memory material layer, wherein after the step of creating a plurality of nanopores, the nanoporous layer also comprises a dielectric material.

18. The method of claim 17, wherein the step of filling the nanopores comprises electrodeposition using the first contact layer as an electrode in the electrodeposition.

19. The method of claim 17, wherein the step of depositing the nanoporous layer comprises depositing a fourth conductive material and the step of creating the plurality of nanopores comprises anodizing the fourth conductive material to convert it to the dielectric material that contains the nanopores and removing any non-anodized material from the plurality of nanopores.

20. The method of claim 19, wherein the step of depositing the fourth conductive material further comprises patterning the fourth conductive material with a plurality of defects.

21. The method of claim 17, wherein the step of depositing the nanoporous layer comprises depositing a diblock copolymer and the step of creating the plurality of nanopores comprises annealing the diblock copolymer under an applied electric field to create cylindrical microdomains, exposing the diblock copolymer to ultra-violet light to degrade a selected number of the cylindrical microdomains, and removing degraded material from the nanopores.

* * * * *